United States Patent
Broach et al.

(10) Patent No.: US 7,932,754 B1
(45) Date of Patent: Apr. 26, 2011

(54) OPTIMAL CONTROL OF CHARGE-MODULATED GATE DRIVERS

(75) Inventors: Michael Eugene Broach, San Mateo, CA (US); Michael D. Mulligan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/506,335

(22) Filed: Aug. 17, 2006

(51) Int. Cl.
H03B 1/00 (2006.01)
H03K 3/00 (2006.01)

(52) U.S. Cl. ........................ 327/112; 327/108

(58) Field of Classification Search .................. 327/427, 327/172, 110, 108, 112; 323/282, 284, 285
See application file for complete search history.

(56) References Cited

U.S. PATENT DOCUMENTS

| | | | |
|---|---|---|---|
| 5,717,345 A * | 2/1998 | Yokomizo et al. | 326/80 |
| 6,025,706 A * | 2/2000 | Takimoto et al. | 323/282 |
| 6,278,294 B1 * | 8/2001 | Taniguchi | 326/80 |
| 6,806,695 B1 | 10/2004 | Broach et al. | 323/513 |
| 6,850,100 B2 * | 2/2005 | Takeshita | 327/112 |
| 7,000,128 B1 | 2/2006 | Broach | 713/320 |
| 2005/0206436 A1 * | 9/2005 | Harriman et al. | 327/427 |

OTHER PUBLICATIONS

Mulligan et al., "A Constant-Frequency Method for Improving Light-Load Efficiency in Synchronous Buck Converters," *IEEE Electronics Letters*, vol. 3, No. 1, Mar. 2005, pp. 24-29.
Chen et al.. "A Resonant MOSFET Gate Drivier with Efficient Energy Recovery,", *IEEE Transactions on Power Electronics*, vol. 19, No. 2, Mar. 2004, pp. 470-477.
Wiegman, "A Resonant Pulse Gate Drive for High Frequency Applications," *IEEE*, 1992, pp. 738-743.

* cited by examiner

*Primary Examiner* — Lincoln Donovan
*Assistant Examiner* — Daniel Rojas

(57) ABSTRACT

A system, apparatus and method is arranged to adaptively adjust drive signals for a gate controlled switch circuit such that the amount of gate swing automatically changes based on the load conditions. An adaptive gate charge modulation (GCM) technique can be utilized to dynamically adjust the drive signals so that a substantially constant voltage drop is perceived across to a gate controlled switch circuit. The voltage drop across the gate controlled switch circuit can be set to a reference level that is adjusted whenever a change in system conditions are detected. The gate charge can then be adaptively increased and decreased during operation, within maximum and minimum limits, to substantially match the voltage drop of the gate control switch circuit to the reference level.

20 Claims, 10 Drawing Sheets

OPTIMAL CONTROL OF CHARGE-MODULATED GATE DRIVERS

FIELD OF THE INVENTION

The present disclosure relates generally to the field of power devices and circuits that are useful for driving a load in a switched mode power supply (SMPS). More particularly, the present disclosure is related to a system, apparatus and method for adaptively adjusting drive signals for a gate controlled switch circuit such that the amount of gate swing automatically changes based on the load conditions.

BACKGROUND OF THE INVENTION

A conventional switched-mode power supply (SMPS) uses a field effect transistor (FET) to drive current through an inductor to a load. A driver circuit in the conventional SMPS is configured to control the activation/deactivation of the FET via a gate control signal. Current is typically sourced from a power supply terminal to the load through the inductor when the FET is active or "ON" so that the inductor is charged. Current is typically sunk from the load through a freewheeling diode when the FET is inactive or "OFF" so that the inductor is discharged. By adjusting the "ON" and "OFF" time (or pulse-width) of the FET, the inductor is effectively charged to a desired level so that an appropriate current is provided to the load. The amount of current delivered to the load is determined in part by the duty-cycle and frequency of the gate control signal that controls the FET.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
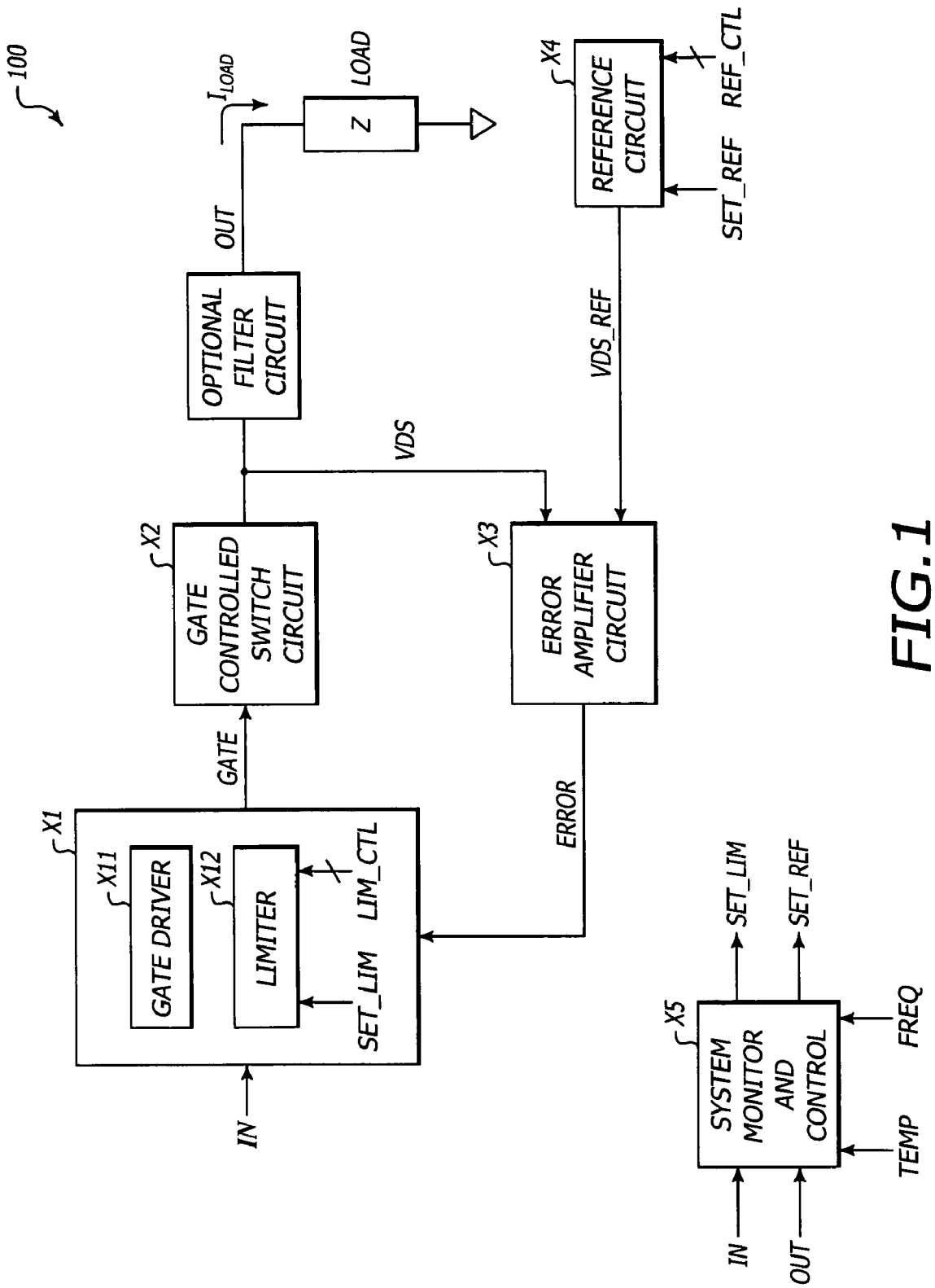
FIG. 1 is an illustrative schematic of a gate-charge modulated (GCM) converter.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the present disclosure is related to a system, apparatus and method for adaptively adjusting drive signals for a gate controlled switch circuit such that the amount of gate swing automatically changes based on the load conditions. An adaptive gate charge modulation (GCM) technique can be utilized to dynamically adjust the drive signals so that a substantially constant voltage drop is perceived across to a gate controlled switch circuit. The voltage drop across the gate controlled switch circuit can be set to a reference level that is adjusted whenever a change in system conditions are detected. The gate charge can then be adaptively increased and decreased during operation, within maximum and minimum limits, to substantially match the voltage drop of the gate control switch circuit to the reference level.

FIG. 1 is an illustrative schematic of a gate-charge modulated (GCM) converter (100) that is arranged in accordance with aspects of the present disclosure. GCM converter 100 includes a gate control circuit (X1), a gate controlled switch circuit (X2), an error amplifier circuit (X3), a reference circuit (X4), and a system monitor and control circuit (X5).

The gate control circuit (X1) is arranged to generate a gate control signal (GATE) in response to an input signal (IN) and a feedback signal (ERROR). Gate control circuit X1 may be functionally partitioned into a gate driver circuit (X11) and a limiter circuit (X12), where the functional partitions can be implemented as separate circuits or as a common circuit. Alternatively, the limiter functions can be implemented separate from the gate control circuit.

The gate controlled switch circuit (X2) is arranged to drive current ($I_{LOAD}$) to a load (Z) in response to the gate control signal (GATE) so that an output voltage (OUT) develops across the load (Z). An optional filter circuit can be inserted between the gate control switch circuit (X2) and the load (Z). The error amplifier circuit (X3) is arranged to adjust the feedback signal (ERROR) by comparing the voltage drop (e.g., $V_{DS}$) across the gate controlled switch (X2) to a reference voltage ($V_{DS\_REF}$) that is provided by the reference circuit (X4). The system monitor and control circuit (X5) is arranged to monitor any variety of operating conditions in the GCM converter such as: operating temperature (TEMP), frequency of the converter (FREQ), input signal (IN), output signal (OUT), etc.

When a change in one or more operating conditions is detected, the system monitor and control circuit (X5) is arranged to adjust any number of operating parameters such as the reference voltage ($V_{DS\_REF}$), and any other operating limits such as maximum gate-swing, minimum gate-swing, and other features such as delay control of the gate drive signals. For the example illustrated in FIG. 1, circuit X5 is arranged to adjust the limits in the gate control circuit (X1) via control signals SET_LIM and LIM_CTL, and also arranged to adjust the reference voltage via control signals SET_REF and REF_CTL.

Figure 2:
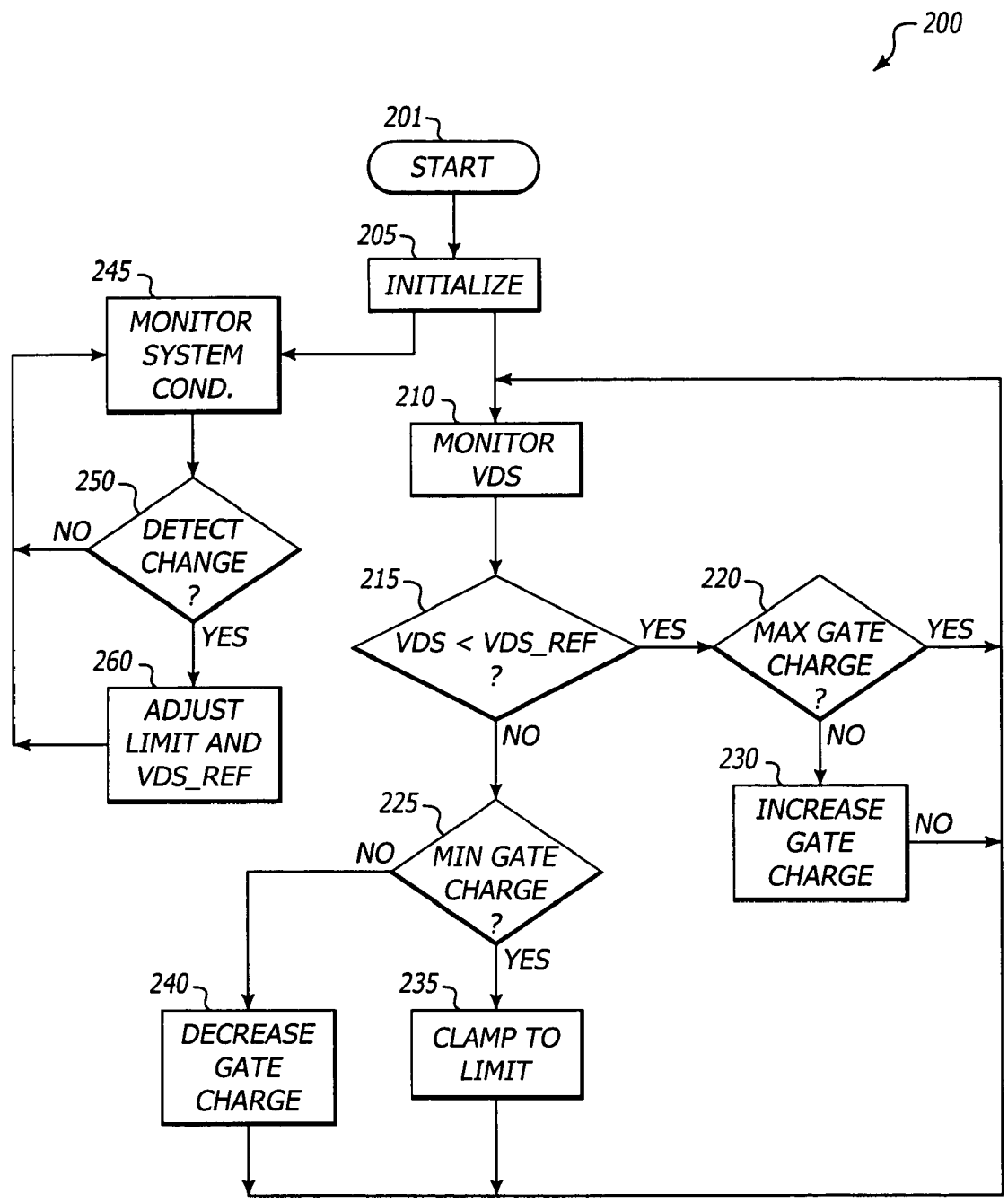
FIG. 2 is an illustrative process flow for a gate-charge modulated (GCM) converter.

FIG. 2 is an illustrative process flow (200) for a gate-charge modulated (GCM) converter that is arranged in accordance with aspects of the present disclosure. Processing flows from start block 201 to block 205.

Block 205 is an initialize block, where various parameters are initialized in the system such as current limit ($I_{LIM}$), reference voltage ($V_{DS\_REF}$), maximum gate charge level (MAX), minimum gate charge level (MIN), etc. A first operating loop is initiated from block 205 when processing flows from block 205 to block 210. A second operating loop can also be initiated in parallel with the first operating loop when processing flows from block 205 to block 245. The first operating loop includes blocks 210, 215, 220, 225, 230, 235 and 240. The second operating loop includes blocks 245, 250 and 260.

At block 210 (MONITOR $V_{DS}$), the voltage drop (e.g., $V_{DS}$) across the gate switching circuit (e.g., X2) is monitored. Proceeding to condition block 215, the system determines if the voltage drop (e.g., $V_{DS}$) for the gate switching circuit (e.g., X2) is less than a reference voltage (e.g., $V_{DS\_REF}$). When the voltage drop (e.g., $V_{DS}$) for the gate switching circuit (e.g., X2) is less than the reference voltage (e.g., $V_{DS}<V_{DS\_REF}$) processing flows from condition block 215 to condition block 220. Otherwise processing continues from condition block 215 to condition block 225.

At condition block 220, the system determines if the current gate charge level has reached a maximum level (MAX). Processing flows from condition block 220 to block 210 when the maximum gate charge level has already been reached. Otherwise, processing flows from condition block 220 to block 230 where the gate charge level is increased. Processing also continues back to block 210 from block 230.

At condition block 225, the system determines if the current gate charge level has reached a minimum level (MIN). Processing flows from condition block 225 to block 235 when the minimum gate charge level has already been reached, where the gate charge level is effectively clamped to the desired limit. Otherwise, processing flows from condition block 225 to block 240 where the gate charge level is decreased. Processing continues back to block 210 from blocks 235 and 240.

At condition block 245, the system monitors operating conditions such as previously described (TEMP, FREQ, etc.). Proceeding to condition block 250 the system determines if a change in the operating conditions has occurred. Processing flows from condition block 250 to block 260 when a change in the operating condition is detected. Processing flows from condition block 250 to block 245 when no change in operating conditions has been detected. At block 260, various operating parameters can be adjusted such as adjusting current limits, charge limits (MIN, MAX, etc.), and adjusting reference voltages (e.g., $V_{DS\_REF}$). Processing continues from block 260 to block 245.

Figure 3:
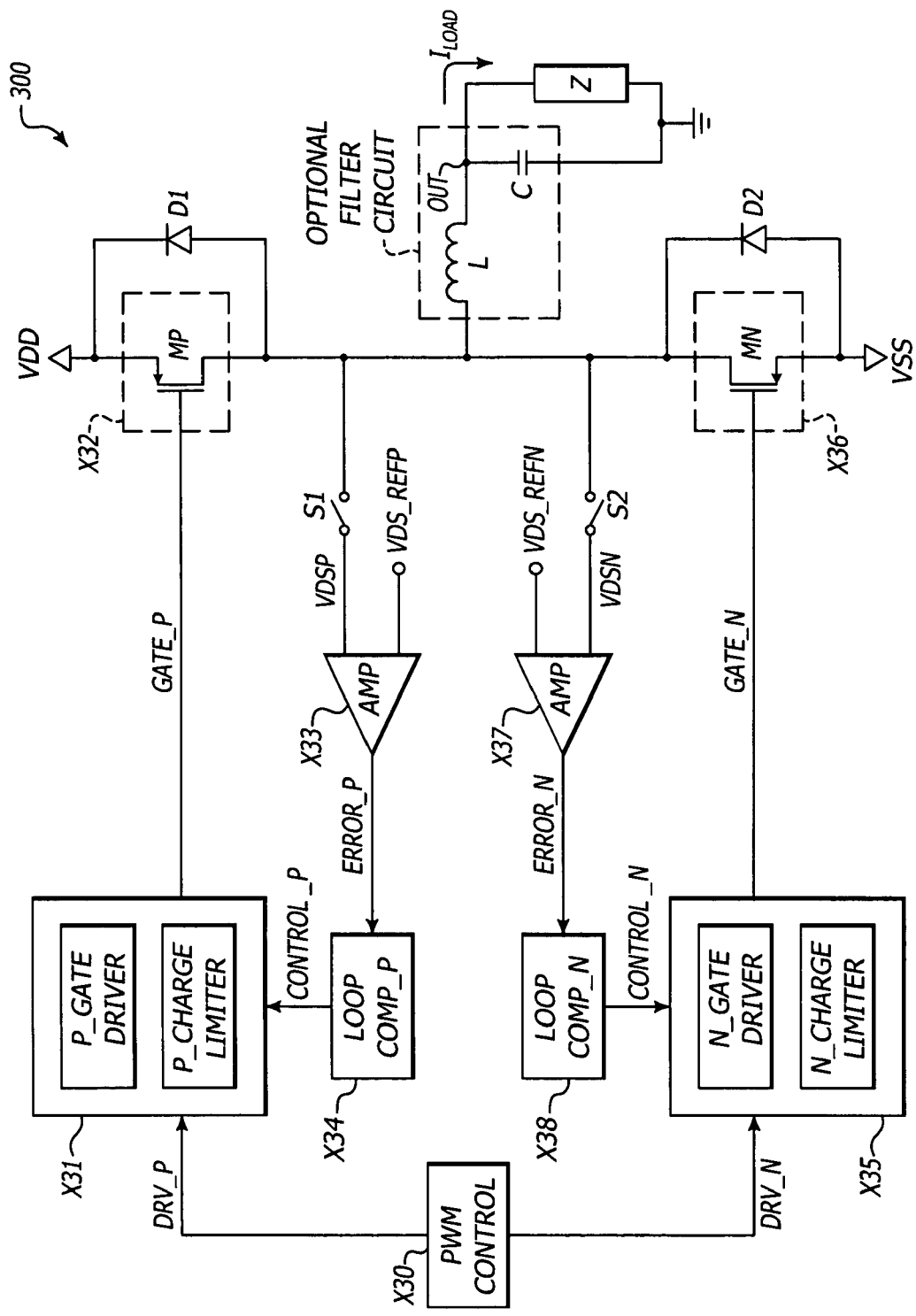
FIG. 3 is an illustrative schematic of another gate-charge modulated (GCM) converter.

FIG. 3 is an illustrative schematic of another gate-charge modulated (GCM) converter (300) that is arranged in accordance with aspects of the present disclosure. GCM converter 300 operates in substantially the same manner as previously described with respect to FIGS. 1-2, with additional detailed circuit implementations as will be described.

GCM converter 300 includes a pulse-width modulator (PWM) control circuit (X30), a p-type gate control circuit (X31), a p-type gate controlled switch circuit (X32), a first diode (D1), a first error amplifier circuit (X33), a first loop compensation circuit (X34), a first controlled sampling switch (S1), an n-type gate control circuit (X35), an n-type gate controlled switch circuit (X36), a second diode (D2), a second error amplifier circuit (X37), a second loop compensation circuit (X38), a second controlled sampling switch (S2), an optional L-C filter circuit, and a load (Z).

PWM control circuit X30 is arranged to generate a first drive signal (DRV_P) for the p-type gate control circuit (X31) and a second drive signal (DRV_N) for the n-type gate control circuit (X32). The p-type gate control circuit (X31) is arranged to provide a p-type gate control signal (GATE_P) in response to the first drive signal (DRV_P) and a first feedback control signal (CONTROL_P). The n-type gate control circuit (X35) is arranged to provide an n-type gate control signal (GATE_N) in response to the second drive signal (DRV_N) and a second feedback control signal (CONTROL_N). Similar to that previously discussed for FIG. 1, each gate control circuit (X31, X32) may include a functional partition for a gate driver circuit (P_GATE/N_GATE DRIVER) and a limiter circuit (P_CHARGE/N_CHARGE LIMITER).

The p-type gate controlled switch circuit (X32) includes a p-type transistor (MP) that is arranged to selectively source current from a first supply ($V_{DD}$) to the load (Z) in response to the p-type gate control signal (GATE_P). The n-type gate controlled switch circuit (X36) includes an n-type transistor (MN) that is arranged to selectively sink current from the load (Z) to a second supply ($V_{ss}$) in response to the n-type gate control signal (GATE_N). Diode D1 is a freewheeling diode that is coupled in parallel with the p-type gate controlled switch circuit (X32). Diode D2 is another freewheeling diode that is coupled in parallel with the n-type gate controlled switch circuit (X36).

The first controlled sampling switch (S1) is arranged to coupled a first voltage drop (e.g., $V_{DSP}$) associated with the p-type gate controlled switch circuit (X32) to an input of the first error amplifier circuit (X33). The first error-amplifier circuit (X33) is arranged to provide a first error signal (ERROR_P) in response to a comparison between the first voltage drop ($V_{DSP}$) and a first reference voltage ($V_{DS\_REFP}$). The first loop compensation circuit (X34) is arranged to provide the first feedback control signal (CONTROL_P) in response to the first error signal (ERROR_P).

The second controlled sampling switch (S2) is arranged to couple a second voltage drop (e.g., $V_{DSN}$) associated with the n-type gate controlled switch circuit (X36) to an input of the second error amplifier circuit (X37). The second error-amplifier circuit (X37) is arranged to provide a second error signal (ERROR_N) in response to a comparison between the second voltage drop ($V_{DSN}$) and a second reference voltage ($V_{DS\_REFN}$). The second loop compensation circuit (X38) is arranged to provide the second feedback control signal (CONTROL_N) in response to the second error signal (ERROR_N).

The above described system, apparatus and method is arranged to maintain a substantially constant voltage drop across the gate controlled switch circuits. For example, transistor MP will have a constant voltage drop across the drain to source terminals that are associated with the common output node and the power supply node for $V_{DD}$, while transistor MN will have a constant voltage drop across the drain to source terminals that are associated with the common output node and the power supply node for $V_{SS}$. When the load (Z) is a "light" load with relatively high impedance, very little current will be necessary to drive the output voltage (OUT) to a desired value. When the load (Z) is a "heavy" load with relatively low impedance (less than 100 ohms), very high currents will be necessary to drive the output voltage (OUT) to a desired value. For optimal operation of the gate controlled switch circuits, the swing (e.g., the peak-to-peak variation in the amplitude of the gate voltage during operation) associated with the gate voltage for each FET should be adaptively adjusted to achieve optimal operation.

The drain-source voltage ($V_{DS}$) for each FET is determined by the resistance ($R_{DS}$) associated with the transistor and the current ($I_{LOAD}$) that is provided to the load (Z). The resistance between the drain and source terminals is determined by the channel resistance ($R_{CHANNEL}$) and the resistance of the metallization associated with the FET and interconnect ($R_{METAL}$). The drain-source voltage ($V_{DS}$) can thus be expressed as:

$$V_{DS} = I_{LOAD} * (R_{METAL} + R_{CHANNEL}). \quad (1)$$

The optimal gate swing associated with an FET can be determined by the root-mean-square current ($I_{RMS}$), the parasitic gate capacitance of the FET ($C_{GATE}$), the input voltage of the converter ($V_{IN}$), the switching frequency ($f_{SW}$), a constant associated with technology processing parameters ($k = \mu C_{OX} W/L$), and the threshold voltage associated with the FET ($V_{TH}$), which is given as:

$$V_{SWING,OPT} = \sqrt{\frac{(I_{RMS})^2}{k \cdot C_{GATE} \cdot V_{IN} \cdot f_{SW}}} + |V_{TH}|. \quad (2)$$

The equation of the channel resistance in a metal oxide semiconductor (MOS) FET is given as:

$$R_{CHANNEL} \approx \frac{1}{k \cdot (V_{SWING} - |V_{TH}|)}. \quad (3)$$

Substituting equation (2) into (3) yields:

$$R_{CHANNEL} \approx \sqrt{\frac{C_{GATE} \cdot V_{IN} \cdot f_{SW}}{k \cdot (I_{RMS})^2}}. \quad (3)$$

Substituting equation (3) into (1):

$$V_{DS,OPT} = I_{LOAD} \cdot \left( R_{METAL} + \sqrt{\frac{C_{GATE} \cdot V_{IN} \cdot f_{SW}}{k \cdot (I_{RMS})^2}} \right). \quad (5)$$

Assuming that the switching is operated under continuous conduction mode (CCM) operation, with a conduction duty-cycle that is given by $D_{SW}$, and substituting into equation (5) yields:

$$V_{DS,OPT} = I_{LOAD} \cdot \left( R_{METAL} + \sqrt{\frac{C_{GATE} \cdot V_{IN} \cdot f_{SW}}{k \cdot D_{SW} \left( (I_{LOAD})^2 + \frac{(\Delta i)^2}{3} \right)}} \right). \quad (6)$$

Referring to equation (6) above, the $V_{DS}$ for a MOSFET device will only remain relatively constant when $\Delta i$ and $R_{METAL}$ are negligible. The metal resistance can be dealt with by utilizing improved layout techniques and technology advancements such as lower resistance metals (e.g., copper metallization). Generally speaking, $R_{METAL}$ can be considered as negligible as long as proper layout and metallization is used.

Under high load conditions, $I_{LOAD}$ is significantly higher than $\Delta i$ and equation (6) can be reduced to the following expression that is independent of the $I_{LOAD}$:

$$V_{DS,OPT} \approx \left( \sqrt{\frac{C_{GATE} \cdot V_{IN} \cdot f_{SW}}{k \cdot D_{SW}}} \right), \text{ for } I_{LOAD} >> \Delta i. \quad (7)$$

Under light load conditions $I_{LOAD}$ is significantly smaller than $\Delta i$ and equation (2) becomes approximately constant:

$$V_{SWING,OPT} = \Delta i \cdot \sqrt{\frac{D_{SW}}{3 \cdot k \cdot C_{GATE} \cdot V_{IN} \cdot f_{SW}}} + |V_{TH}|, \text{ for } I_{LOAD} << \Delta i. \quad (8)$$

Equations (7) and (8) can be utilized for a gate-charge modulation control method according to the illustrated examples of FIGS. 1-3 described above. The voltage drop associated with the gate controlled switch circuit is evaluated when the switch circuit is conducting (e.g., $V_{DS}$ of MP is evaluated when MP is active). The error amplifier compares the evaluated voltage drop and adjusts the gate charge control until the voltage drop is matched to the reference voltage such as described by equation (7) when the rms current ($I_{RMS}$) is dominated by the load current ($I_{LOAD}$). The limiting functions in the gate control circuit are arranged to limit the gate swing when the rms current ($I_{RMS}$) is dominated by the ripple current ($\Delta i$) such as described by equation (8).

Figure 8:
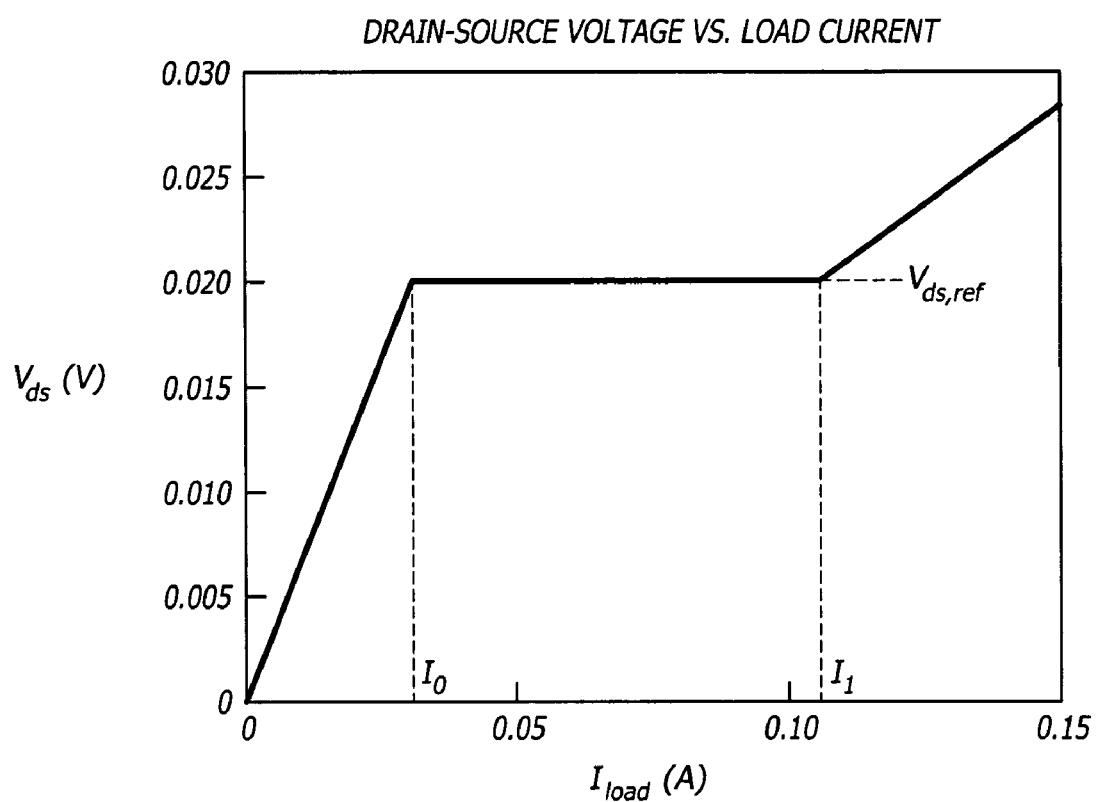
FIG. 8 is an illustrative graphical plot of voltage drop vs. load current.

FIG. 8 is an illustrative graphical plot of voltage drop vs. load current for a system that is arranged in accordance with aspects of the present disclosure. As illustrated in the figure, the voltage drop associated with the gate controlled switch circuit (e.g., $V_{DS}$ of a FET) is matched to the reference voltage (e.g., $V_{DS, REF}$) when the load current is in a range from $I_0$ to $I_1$. When the load currents exceed a maximum limit that is designated by $I_1$, the voltage drop across the gate controlled switch circuit cannot remain constant and thus increases. Similarly, when the load current is below a minimum threshold as designated by $I_0$, the voltage drop increases with increasing load current.

Figure 9:
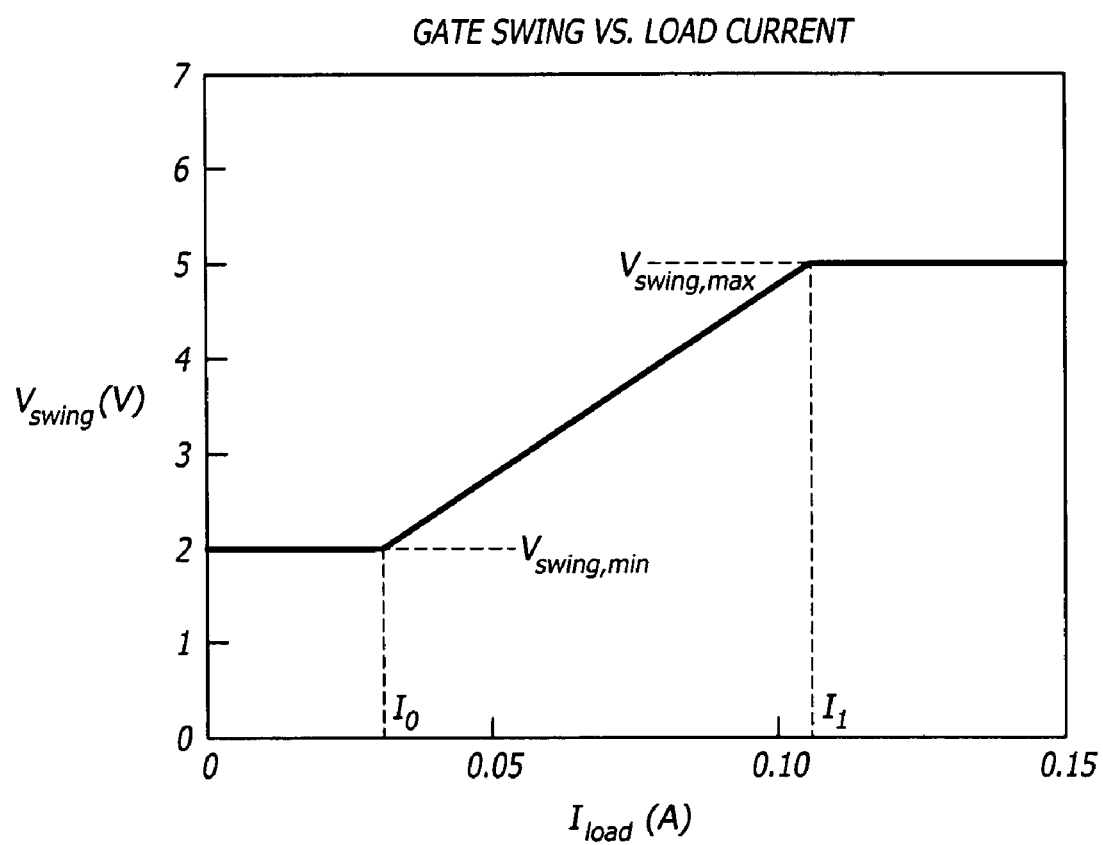
FIG. 9 is an illustrative graphical plot of gate swing vs. load current.

FIG. 9 is an illustrative graphical plot of gate swing vs. load current for a system arranged in accordance with aspects of the present disclosure. As shown in the figure, the swing associated with the gate voltage is held at a constant minimum value ($V_{SWING, MIN}$) for very light load conditions ($I_{LOAD} < I_0$), and held to a constant maximum value ($V_{SWING, MAX}$) for high load conditions ($I_{LOAD} > I_1$). When the load current ranges between the minimum and maximum load conditions ($I_0 < I_{LOAD} < I_1$) the gate swing varies linearly.

Figure 10:
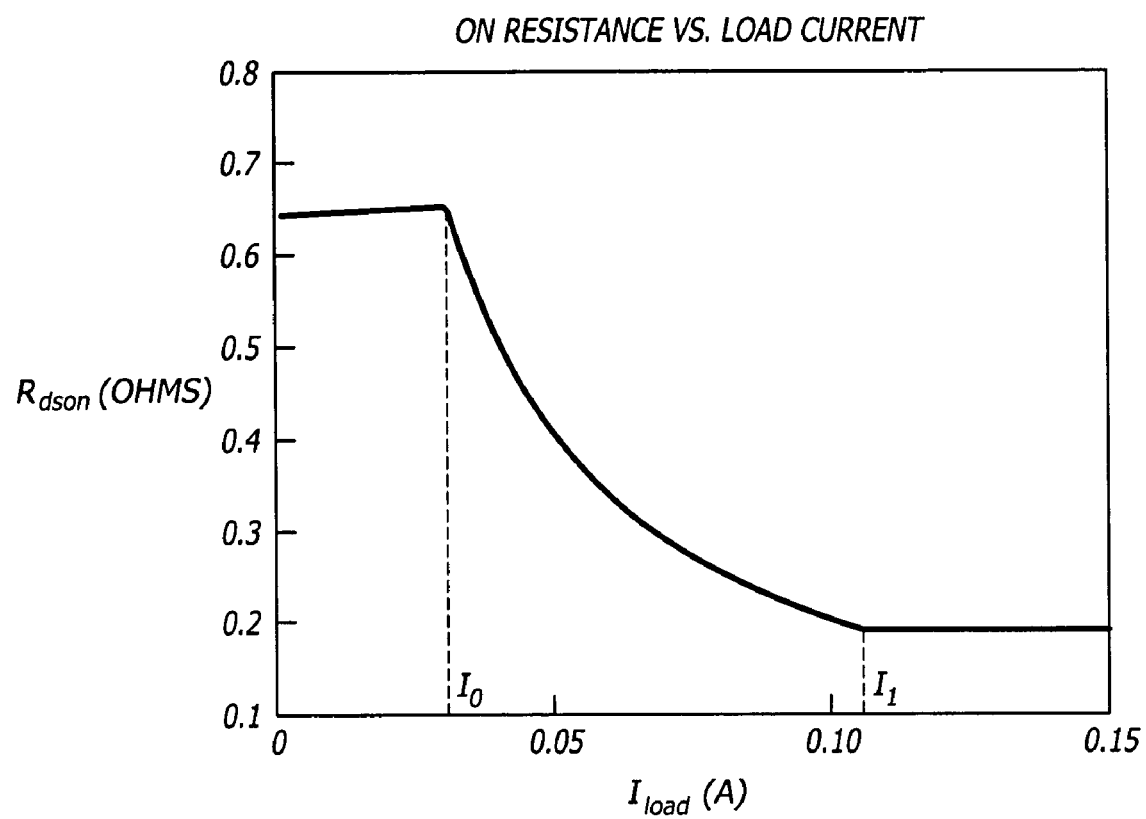
FIG. 10 is an illustrative graphical plot of on-resistance vs. load current, for a system, apparatus and/or method arranged in accordance with aspects of the present disclosure.

FIG. 10 is an illustrative graphical plot of on-resistance vs. load current for a system arranged in accordance with aspects of the present disclosure. The drain-source on-resistance ($R_{DSON}$) for a FET non-linearly decreases when the load current ($I_{LOAD}$) ranges from minimum to maximum load condition ($I_0 < I_{LOAD} < I_1$). For very light load conditions ($I_{LOAD} < I_0$), the drain-source resistance on-resistance ($R_{DSON}$) is at a maximum value since the gate drive is reduced to a minimum. For very heavy load conditions ($I_{LOAD} > I_1$), the drain-source resistance on-resistance ($R_{DSON}$) is at a minimum value since the gate drive is increased to a maximum.

Figure 4:
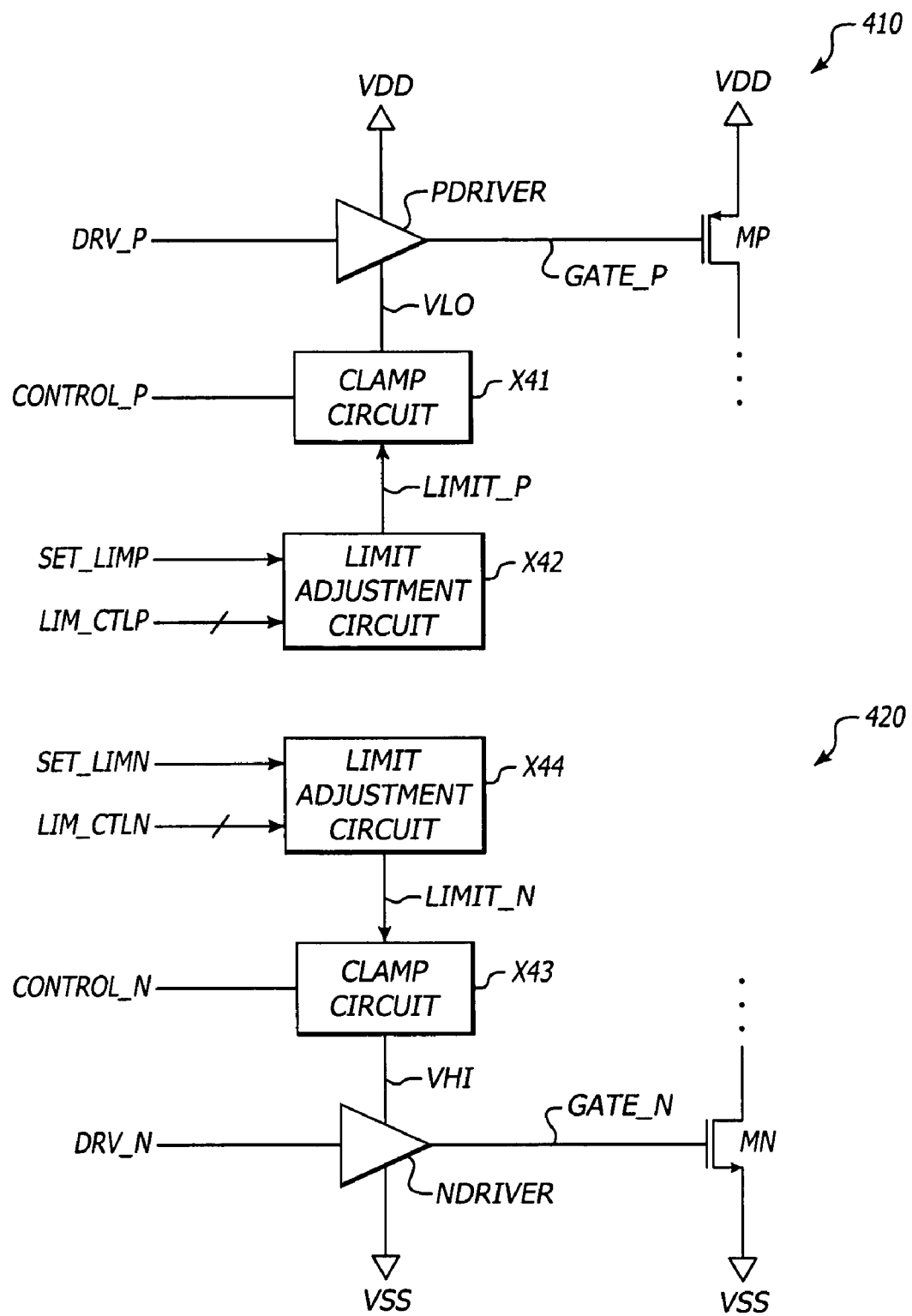
FIG. 4 is an illustrative schematic of yet another gate-charge modulated (GCM) converter with limit adjustments in a power supply control topology.

FIG. 4 is an illustrative schematic of yet another gate-charge modulated (GCM) converter (400) with limit adjustments in the power-supply control topology that is arranged in accordance with aspects of the present disclosure. GCM converter 400 operates in substantially the same manner as previously described with respect to FIGS. 1-3, with additional detailed circuit implementations as will be described.

A power supply control topology for a p-type gate controlled switch circuit (e.g., MP) is illustrated as 410, where the p-type gate driver circuit (PDRIVER) is arranged to provide a gate control signal (GATE_P) in response to drive signal DRV_P. The gate control signal has a limited voltage range between VLO and VDD. VLO is adjusted by a clamp circuit (X41), which is response to control signals CONTROL_P and LIMIT_P. Control signal CONTROL_P corresponds to the feedback control signal such as illustrated in FIG. 3, while LIMIT_P is a parameter that can be adjusted based on various initialization parameters or based on user selected ranges of operation. A limit adjustment circuit (X42) is arranged to adjust the lower voltage limit (VLO), which may be associated with a local power supply, in response to control signals such as SET_LIMP and LIM_CTLP. Signal LIM_CTLP can either be an analog control signal or a digital control signal that is used to adjust the lower voltage limit (VLO) when signal SET_LIMP is asserted.

A power supply control topology for an n-type gate controlled switch circuit (e.g., MN) is illustrated as 420, where the n-type gate driver circuit (NDRIVER) is arranged to provide a gate control signal (GATE_N) in response to drive signal DRV_N. The gate control signal has a limited voltage range between VHI and VSS. VHI is adjusted by a clamp circuit (X43), which is response to control signals CONTROL_N and LIMIT_N. Control signal CONTROL_N corresponds to the feedback control signal such as illustrated in FIG. 3, while LIMIT_N is a parameter that can be adjusted based on various initialization parameters or based on user selected ranges of operation. A limit adjustment circuit (X44) is arranged to adjust the upper voltage limit (VHI), which may be associated with the local power supply, in response to control signals such as SET_LIMN and LIM_CTLN. Signal LIM_CTLN can either be an analog control signal or a digital control signal that is used to adjust the upper voltage limit (VHI) when signal SET_LIMN is asserted.

Figure 5:
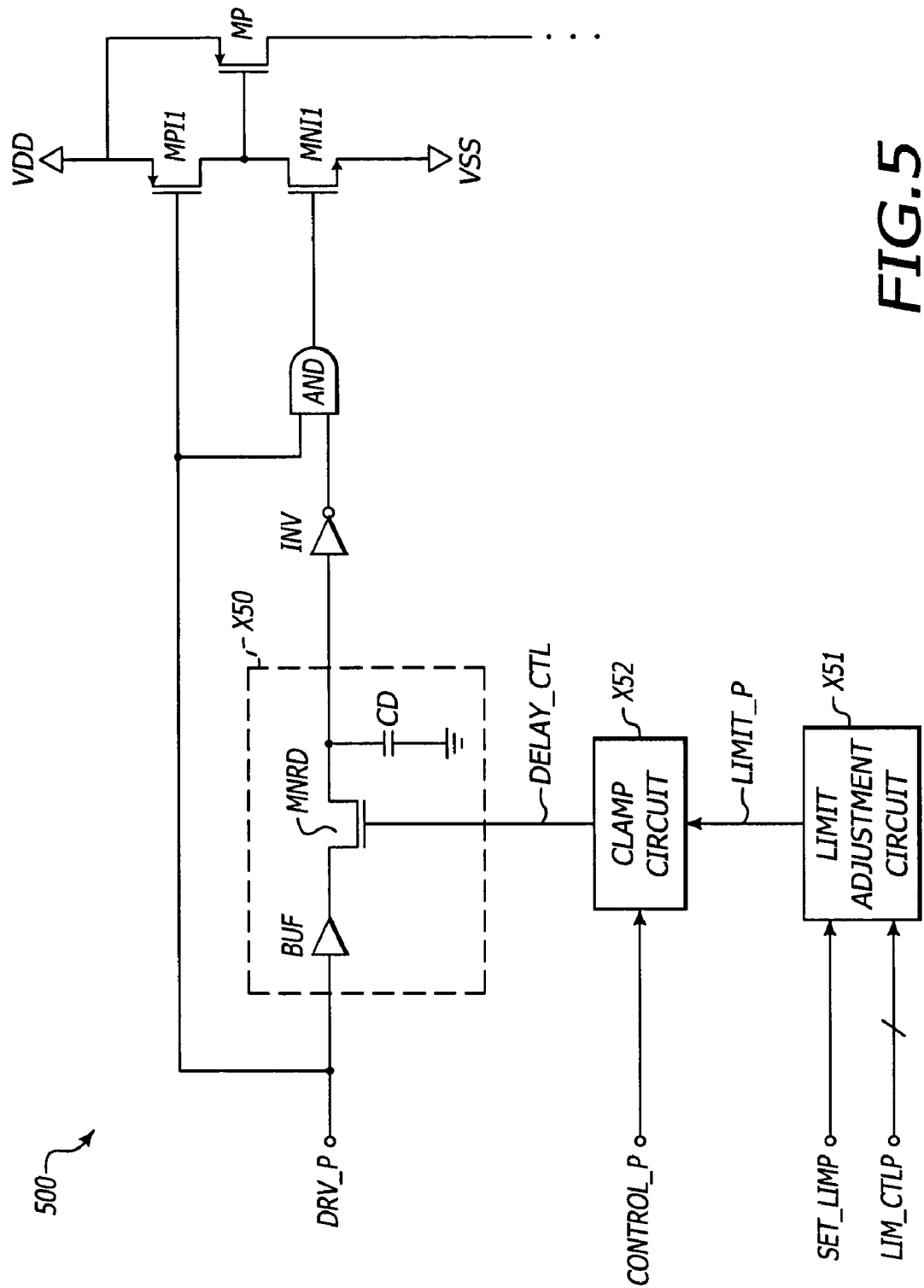
FIG. 5 is an illustrative schematic of a still another gate-charge modulated (GCM) converter with limit adjustments in a delay control topology.

FIG. 5 is an illustrative schematic of a still another gate-charge modulated (GCM) converter (500) with limit adjustments in a delay control topology that is arranged in accordance with aspects of the present disclosure. GCM converter 500 operates in substantially the same manner as previously described with respect to FIGS. 1-3, with additional detailed circuit implementations as will be described.

A time delay control topology for a p-type gate controlled switch circuit (e.g., MP) is illustrated as 500, where the p-type gate driver circuit is represented by transistors MPI1, MNI1, a variable delay circuit (X50), and logic circuits INV and AND. Transistor MPI1 is used to disable transistor MP when transistor MPI1 is activated when signal DRV_P is asserted low. Transistor MNI1 is also disabled when signal DRV_P is asserted low. When signal DRV_P is asserted high, transistor MPI1 is disabled and after signal DRV_P propagates through the delay circuit (X50), the signal at the gate of transistor MNI1 is asserted via logic circuits INV and AND so that transistor MP is activated.

The variable delay circuit (X50) includes a buffer (BUF), a transistor (MNRO) and a capacitor (C). Signal DRV_P propagates through the buffer to an input side of transistor MNRO. The resistance of transistor MNRO is adjusted in response to a control signal (DELAY_CTL) so that transistor MNRO and capacitor C form an RC filter with an adjustable delay time. An output of inverting logic circuit INV is initially when signal PDRV is asserted high, and toggles low after the adjustable delay time when signal PDRV is changes from a high logic level to a low logic level. Transistor MNI1 is activated when PDRV transitions from a low logic level to a high logic level, where the on-time associated with transistor MNI1 is determined by the delay time through the variable delay circuit (X50).

Clamp circuit X52 is responsive to feedback signal CONROL_P from FIG. 3, where the nominal delay time is set by signal LIMIT_P. The clamp adjustment circuit (X51) is arranged to adjust signal LIMIT_P in response to control signals such as SET_LIMP and LIM_CTLP. Signal LIM_CTLP can either be an analog control signal or a digital control signal that is used to adjust the delay time when signal SET_LIMP is asserted.

Figure 6:
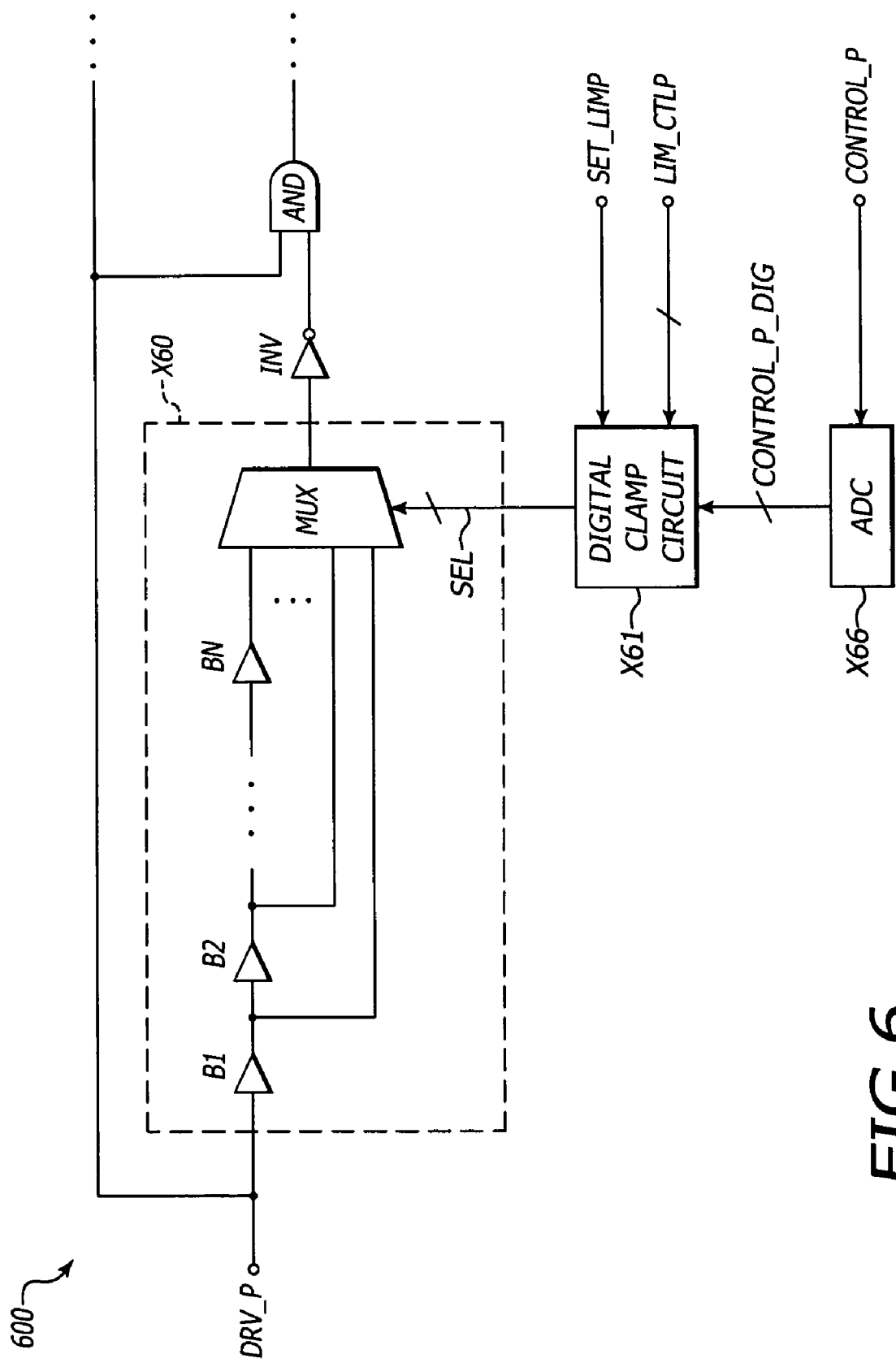
FIG. 6 is an illustrative schematic of a yet still another gate-charge modulated (GCM) converter with limit adjustments in a multiplexer based delay control topology.

FIG. 6 is an illustrative schematic of a yet still another gate-charge modulated (GCM) converter (600) with limit adjustments in a multiplexer based delay control topology that is arranged in accordance with aspects of the present disclosure. GCM converter 600 operates in substantially the same manner as previously described with respect to FIGS. 1-3, with additional detailed circuit implementations as will be described. Furthermore, FIG. 6 operates along the same principals of FIG. 5, where the delay circuit and the control circuit are replaced.

The delay control circuit of FIG. 6 includes a multiplexer and series coupled buffer delay cells (or inverters) B1-BN. The output of each delay cell is further delayed with respect to a preceding delay cell. The output of each delay cell corresponds to a tap-point in a delay line. The multiplexer includes a number of inputs, where each input is coupled to a respective one of the tap-points in the delay line. By changing the selection signal (SEL) to the multiplexer, a different delay cell tap-point can be selected to achieve a desired delay.

A digital clamp circuit (X61) is used to generate the multiplexer select signal (SEL), which is responsive to control signals SET_LIMP, LIM_CTLP and CONTROL_P_DIG. The digital clamp adjustment circuit (X61) is arranged to adjust the delay limits using LIM_CTLP when signal SET_LIMP is asserted. The delay time can vary up to the maximum limit selected in response to signal CONTROL_P_DIG. Signal CONTROL_P_DIG can be a digital control signal that is generated by an analog-to-digital converter in response to the feedback control signal CONTROL_P (see FIG. 3).

Figure 7:
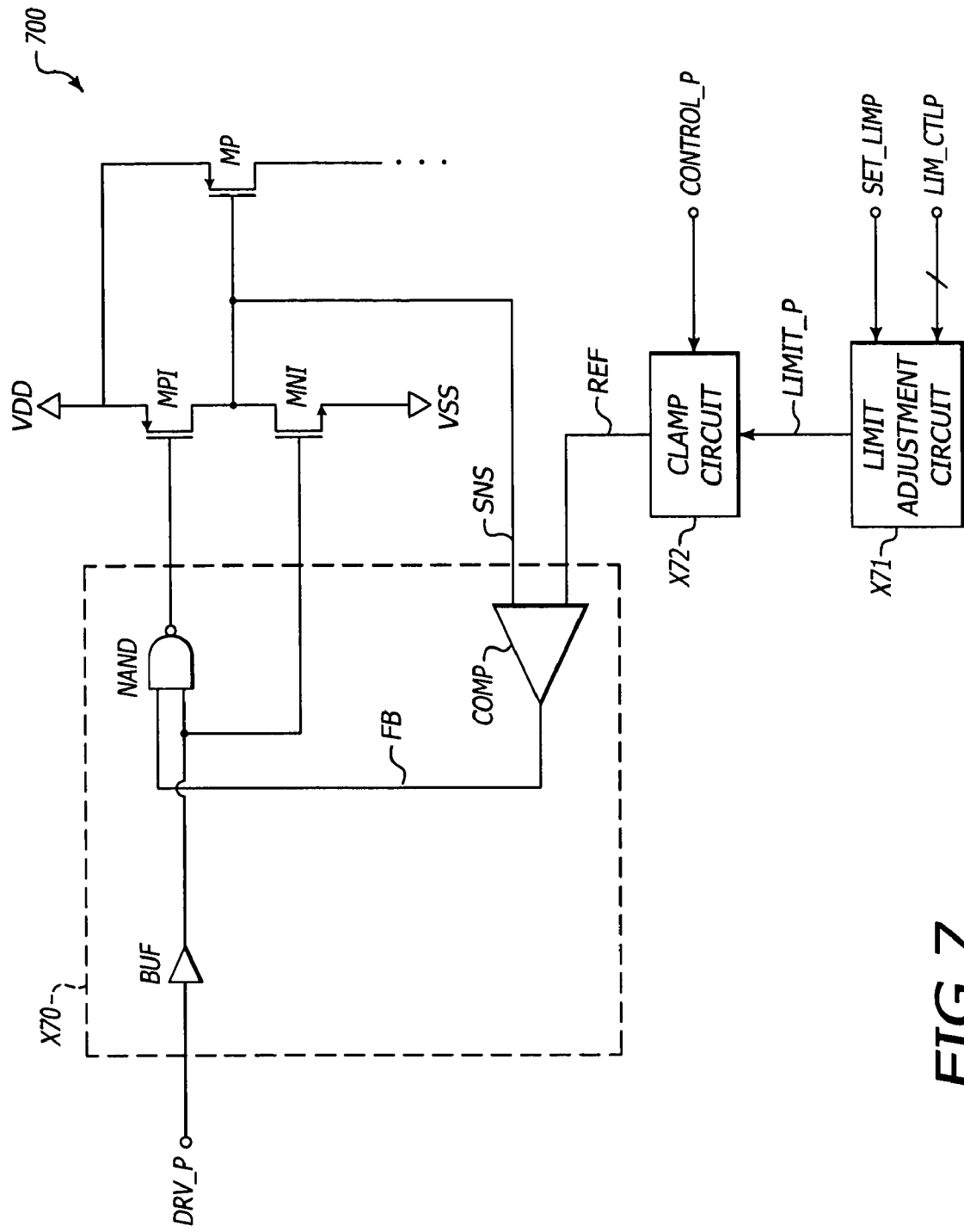
FIG. 7 is an illustrative schematic of a still yet another gate-charge modulated (GCM) converter with limit adjustments in a feedback control topology.

FIG. 7 is an illustrative schematic of a still yet another gate-charge modulated (GCM) converter (700) with limit adjustments in a feedback control topology that is arranged in accordance with aspects of the present disclosure. GCM converter 700 operates in substantially the same manner as previously described with respect to FIGS. 1-3, with additional detailed circuit implementations as will be described.

The GCM converter circuit of FIG. 7 includes a feedback control circuit (X70), two transistors arranged as an inverter (MPI, MN), a limit adjustment circuit (X71), a clamp circuit (X71), and an output transistor (MP) from a gate controlled switch circuit (e.g., see FIGS. 1 and 3). The feedback control circuit (X70) is arranged to adjust the input signal for the gate controlled switch circuit by comparing it to a reference signal (REF) from the clamp circuit.

The feedback control circuit (X70) includes a buffer circuit (BUF), a logic circuit (NAND) and a comparator circuit (COMP). The comparator circuit (COMP) is arranged to provide a feedback signal (FB) that is responsive to a comparison between a sense signal (SNS) and the reference signal (REF). The sense signal (SNS) corresponds to the input signal for the gate controlled switch circuit (e.g., the gate of transistor MP). The buffer circuit is an optional circuit that can be used to buffer the input drive signal (P_DRV). A non-inverted signal from the output of the buffer circuit (relative to signal P_DRV) is arranged to activate transistor MNI, while an inverted signal (relative to signal P_DRV) that is gated by the feedback signal (FB) via the NAND logic circuit is arranged to activate transistor MPI. Since the gate of transistor MP is a gate charge modulated signal, the level can be effectively adjusted by changing the clamp limit via the reference signal (REF).

The clamp circuit (X72) is used to generate the reference signal (REF) in this example implementation, which can be adjusted in response to a feedback control signal (CONTROL_P) based on a limit that is indicated by signal LIMIT_P. The limit adjustment circuit (X72) is arranged to adjust the signal LIMIT_P using LIM_CTLP when signal SET_LIMP is asserted. The clamp level for the feedback signal can vary up to the maximum limit selected (LIMIT_P), responsive to the feedback control signal (CONTROL_P).

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for adaptively adjusting a gate charge modulation (GCM) signal level in a switching converter that is responsive to an input signal to drive a load from a power supply, the apparatus comprising:
    a gate control circuit that is arranged to generate a gate control signal in response to the input signal, wherein the gate control circuit is further arranged such that a signal swing associated with the gate control signal has a voltage amplitude that is adjustably controlled in response to a feedback control signal, wherein the gate control circuit comprises a limit adjustment circuit and a driver circuit, wherein the driver circuit is arranged to provide the gate control signal using the power supply and a local power supply, and wherein the limit adjustment circuit is arranged to dynamically change a voltage level associated with the local power supply;
    a gate controlled switch circuit that is arranged to drive current to the load with a current magnitude that is determined in response to the voltage amplitude of the gate control signal, wherein an output of the gate controlled switch circuit has an associated voltage drop relative to the power supply that is at least partially dependent upon the load, wherein the gate controlled switch circuit comprises a p-type field effect transistor and an n-type field effect transistor that are configured to drive the load;
    an error amplifier circuit that is arranged to adjust an error signal in response to a differential comparison between a reference signal and the voltage drop associated with the gate controlled switch circuit, wherein the error amplifier circuit comprises a differential amplifier that is arranged to provide the error signal responsive to a first drain to source voltage associated with at least one of the field effect transistors; and
    a loop compensation circuit arranged to generate the feedback control signal in response to the error signal.

2. The apparatus of claim 1, wherein the gate controlled switch circuit is coupled to the load through a filter circuit.

3. The apparatus of claim 1, wherein the gate control circuit is arranged to adjustably limit the signal swing associated with the gate control signal in response to a limit control signal.

4. The apparatus of claim 1, further comprising a reference circuit that is arranged to generate the reference signal for the error amplifier circuit in response to a reference control signal.

5. The apparatus of claim 1, wherein the error amplifier circuit comprises (i) a first amplifier that is arranged to provide a first error signal responsive to the first drain to source voltage associated with the p-type field effect transistor and (ii) a second amplifier that is arranged to provide a second error signal responsive to a second drain to source voltage associated with the n-type field effect transistor.

6. An apparatus for adaptively adjusting a gate charge modulation (GCM) signal level in a switching converter that is responsive to an input signal to drive a load from a power supply, the apparatus comprising:
    a gate control circuit that is arranged to generate a gate control signal in response to the input signal, wherein the gate control circuit is further arranged such that a signal swing associated with the gate control signal is adjustably controlled in response to a feedback control signal, wherein the gate control circuit comprises a limit adjustment circuit and a driver circuit, wherein the driver circuit is arranged to provide the gate control signal using the power supply and a local power supply, and wherein the limit adjustment circuit is arranged to dynamically change a voltage level associated with the local power supply;
    a gate controlled switch circuit that is arranged to drive the load in response to the gate control signal, wherein an output of the gate controlled switch circuit has an associated voltage drop relative to the power supply that is at least partially dependent upon the load, wherein the gate controlled switch circuit includes a p-type field effect transistor and an n-type field effect transistor, wherein the voltage drop associated with the gate controlled switch circuit corresponds to at least one drain to source voltage associated with at least one of the field effect transistors; and
    an error amplifier circuit that is arranged to adjust the feedback control signal in response to a comparison between a reference signal and the voltage drop associated with the gate controlled switch circuit, wherein the error amplifier circuit comprises a differential amplifier that is arranged to provide the feedback control signal.

7. The apparatus of claim 6, further comprising
    a system monitor and control circuit that is arranged to adjust at least one parameter for the apparatus in response to one or more monitored operating conditions;
    wherein the at least one parameter corresponds to at least one of: a maximum level associated with the signal swing, a minimum level associated with the signal swing, a minimum gate charge associated with the gate controlled switch circuit, a maximum gate charge associated with the gate controlled switch circuit, a delay associated with activating the gate controlled switch circuit, a delay associated with deactivating the gate controlled switch circuit, and the reference signal.

8. The apparatus of claim 7, wherein:
    the system monitor and control circuit is arranged to monitor at least one additional operating condition; and
    the at least one additional operating condition comprises at least one of: an operating temperature associated with the apparatus, a frequency associated with the input signal, a signal level associated with the input signal, a signal level associated with the load, and a signal level associated with the output of the gate controlled switch circuit.

9. An apparatus for adaptively adjusting a gate charge modulation (GCM) signal level in a switching converter that is responsive to an input signal to drive a load from a power supply, the apparatus comprising:
  a gate control circuit that is arranged to generate a gate control signal in response to the input signal, wherein the gate control circuit is further arranged such that a signal swing associated with the gate control signal is adjustably controlled in response to a feedback control signal, wherein the gate control circuit comprises a limit adjustment circuit and a driver circuit, wherein the driver circuit is arranged to provide the gate control signal using the power supply and a local power supply, and wherein the limit adjustment circuit is arranged to dynamically change a voltage level associated with the local power supply;
  a gate controlled switch circuit that is arranged to drive the load in response to the gate control signal, wherein an output of the gate controlled switch circuit has an associated voltage drop relative to the power supply that is at least partially dependent upon the load, wherein the gate controlled switch circuit comprises a p-type field effect transistor and an n-type field effect transistor that are arranged in a push-pull configuration to drive the load; and
  an error amplifier circuit that is arranged to adjust the feedback control signal in response to a comparison between a reference signal and the voltage drop associated with the gate controlled switch circuit, wherein the error amplifier circuit comprises (i) a first amplifier that is arranged to provide a first error signal responsive to a first drain to source voltage associated with the p-type field effect transistor and (ii) a second amplifier that is arranged to provide a second error signal responsive to a second drain to source voltage associated with the n-type field effect transistor.

10. The apparatus of claim 9, wherein:
  the first amplifier is arranged to compare the first drain to source voltage to a first reference signal; and
  the second amplifier is arranged to compare the second drain to source voltage to a second reference signal.

11. The apparatus of claim 10, wherein:
  the first amplifier is arranged to sample the first drain to source voltage; and
  the second amplifier is arranged to sample the second drain to source voltage.

12. An apparatus for adaptively adjusting a gate charge modulation (GCM) signal level in a switching converter that is responsive to an input signal to drive a load from a power supply, the apparatus comprising:
  a gate control circuit that is arranged to generate a gate control signal in response to the input signal, wherein the gate control circuit is further arranged such that a signal swing associated with the gate control signal is adjustably controlled in response to a feedback control signal, wherein the gate control circuit comprises a limit adjustment circuit and a driver circuit, wherein the driver circuit is arranged to provide the gate control signal using the power supply and a local power supply, and wherein the limit adjustment circuit is arranged to dynamically change a voltage level associated with the local power supply;
  a gate controlled switch circuit that is arranged to drive the load in response to the gate control signal, wherein an output of the gate controlled switch circuit has an associated voltage drop relative to the power supply that is at least partially dependent upon the load, wherein the power supply corresponds to a selected one of a higher power supply and a lower power supply, and wherein the local power supply corresponds to a non-selected one of the higher power supply and the lower power supply; and
  an error amplifier circuit that is arranged to adjust the feedback control signal in response to a differential comparison between a reference signal and the voltage drop associated with the gate controlled switch circuit such that a change in the load causes a corresponding change in the voltage drop relative to the power supply and the change in the voltage drop relative to the power supply causes a change in the feedback control signal.

13. An apparatus for adaptively adjusting a gate charge modulation (GCM) signal level in a switching converter that is responsive to an input signal to drive a load from a power supply, the apparatus comprising:
  a gate control circuit that is arranged to generate a gate control signal in response to the input signal, wherein the gate control circuit is further arranged such that a signal swing associated with the gate control signal is adjustably controlled in response to a feedback control signal, wherein the gate control circuit comprises a limit adjustment circuit and a driver circuit, wherein the driver circuit is arranged to provide the gate control signal using the power supply and a local power supply, wherein the limit adjustment circuit is arranged to dynamically change a voltage level associated with the local power supply, wherein the gate control circuit further comprises a variable delay circuit, a logic circuit, and a clamp circuit, wherein the variable delay circuit is arranged to cooperate with the logic circuit to provide the gate control signal in response to the input signal according to a delay that is determined by the variable delay circuit, wherein the variable delay circuit is arranged to determine the delay by a delay control signal from the clamp circuit, wherein the clamp circuit is responsive to changes in the feedback control signal;
  a gate controlled switch circuit that is arranged to drive the load in response to the gate control signal, wherein an output of the gate controlled switch circuit has an associated voltage drop relative to the power supply that is at least partially dependent upon the load; and
  an error amplifier circuit that is arranged to adjust the feedback control signal in response to a comparison between a reference signal and the voltage drop associated with the gate controlled switch circuit.

14. The apparatus of claim 13, wherein:
  the variable delay circuit comprises an RC filter that is responsive to the input signal;
  the delay for the variable delay circuit is determined by a resistance associated with the RC filter; and
  the clamp circuit is arranged to adjust the resistance of the RC filter via the delay control signal.

15. The apparatus of claim 14, wherein the limit adjustment circuit that is arranged to selectively change a limit associated with the clamp circuit based on one or more monitored operating conditions associated with the apparatus.

16. The apparatus of claim 13, wherein:
  the variable delay circuit comprises a delay line that is responsive to the input signal;

the delay associated with the variable delay circuit is determined by selecting a tap-point in the delay line; and the clamp circuit is arranged to select the tap-point associated with the delay line via the delay control signal.

17. The apparatus of claim 16, further comprising an analog to digital converter that is arranged to provide a digital control signal in response to the feedback control signal, wherein the digital control signal is provided to the clamp circuit by the analog to digital converter.

18. An apparatus for adaptively adjusting a gate charge modulation (GCM) signal level in a switching converter that is responsive to an input signal to drive a load from a power supply, the apparatus comprising:

a gate control circuit that is arranged to generate a gate control signal in response to the input signal, wherein the gate control circuit is further arranged such that a signal swing associated with the gate control signal is adjustably controlled in response to a feedback control signal, wherein the gate control circuit comprises a feedback control circuit and a clamp circuit, wherein the feedback control circuit comprises a comparator circuit and a logic circuit, wherein the comparator circuit is arranged to compare the gate control signal to a reference signal, wherein the clamp circuit is arranged to provide the reference signal, wherein the clamp circuit is responsive to the feedback control signal, and wherein the logic circuit is arranged to selectively control the gate control signal in response to the input signal and the comparison of the gate control signal to the reference signal;

a gate controlled switch circuit that is arranged to drive the load in response to the gate control signal, wherein an output of the gate controlled switch circuit has an associated voltage drop relative to the power supply that is at least partially dependent upon the load; and an error amplifier circuit that is arranged to adjust the feedback control signal in response to a comparison between the reference signal and the voltage drop associated with the gate controlled switch circuit.

19. A system for adaptively adjusting a gate charge modulation (GCM) signal level in a switching converter that is responsive to an input signal to drive a load from a power supply, the system comprising:

a gate control means that is arranged to generate a gate control signal in response to the input signal, wherein the gate control means is further arranged such that a signal swing associated with the gate control signal has a voltage amplitude that is adjustably controlled in response to a feedback control signal, wherein the gate control means comprises a limit adjustment means and a driver means, wherein the driver means is arranged to provide the gate control means using the power supply and a local power supply, and wherein the limit adjustment means is arranged to dynamically change a voltage level associated with the local power supply;

a gate controlled switch means that is arranged to drive current to the load with a current magnitude that is determined in response to the voltage amplitude of the gate control signal, wherein an output of the gate controlled switch means has an associated voltage drop relative to the power supply that is at least partially dependent upon the load, wherein the gate controlled switch means includes field effect transistors that are arranged in a push-pull arrangement;

an error amplifier means that is arranged to adjust the feedback control signal in response to a differential comparison between a reference signal and the voltage drop associated with the gate controlled switch means such that the feedback control signal is responsive to the associated voltage drop; and a system monitor and control means that is arranged to selectively adjust at least one parameter associated with the gate control means based on one or more monitored operating conditions associated with the system, wherein the at least one parameter corresponds to at least one of: a maximum level associated with the signal swing, a minimum level associated with the signal swing, a minimum gate charge associated with the gate controlled switch means, a maximum gate charge associated with the gate controlled switch means, a delay associated with activating the gate controlled switch means, a delay associated with deactivating the gate controlled switch means, and the reference signal.

20. A method for adaptively adjusting a gate charge modulation (GCM) signal level in a switching converter that is responsive to an input signal to drive a load from a power supply, the method comprising:

coupling current to the load from the power supply via a gate controlled switch circuit that is responsive to the input signal, wherein the gate controlled switch circuit includes field effect transistors that are arranged in a push-pull arrangement;

monitoring a voltage drop associated with the gate controlled switch circuit;

in response to a change in the load, determining a monitored voltage drop;

in response to determining that the monitored voltage drop is less than a reference voltage, increasing a gate charge level associated with the gate controlled switch circuit in response to the input signal when a magnitude associated with the monitored voltage drop is below a maximum gate charge level, wherein a voltage amplitude associated with a drive signal to a gate of the gate controlled switch circuit is increased by increasing the gate charge level, and wherein the drive control signal is provided using the power supply and a local power supply, a voltage level associated with the local power supply being dynamically changed;

in response to determining that the monitored voltage drop is greater than or equal to the reference voltage, decreasing the gate charge level associated with the gate controlled switch circuit in response to the input signal when the magnitude associated with the monitored voltage drop is above a minimum gate charge level, wherein the voltage amplitude associated with the drive signal to the gate of the gate controlled switch circuit is decreased by decreasing the gate charge level;

monitoring at least one operating condition associated with the switching converter, wherein the at least one operating condition comprises at least one of an operating temperature associated with at least a portion of the switching converter, a frequency associated with the input signal, a signal level associated with the input signal, a signal level associated with the load, and a signal level associated with an output of the gate controlled switch circuit; and adjusting at least one parameter associated with the gate controlled switch circuit based on the at least one monitored operating condition, wherein the at least one parameter corresponds to at least one of: the reference voltage, a maximum level associated with a signal swing for the gate controlled switch circuit, a minimum level associated with the signal swing, the minimum gate charge level, the maximum gate charge level, a delay associated with activating the gate controlled switch circuit, and a delay associated with deactivating the gate controlled switch circuit.

* * * * *